United States Patent [19]

Horne et al.

[11] 4,127,901

[45] Nov. 28, 1978

[54] MNOS FET MEMORY RETENTION CHARACTERIZATION TEST CIRCUIT

[75] Inventors: Merton A. Horne, Eagan; Thomas A. Pogemiller, Burnsville, both of Minn.

[73] Assignee: Sperry Rand Corporation, New York, N.Y.

[21] Appl. No.: 821,272

[22] Filed: Aug. 3, 1977

[51] Int. Cl.$^2$ .................. G11C 11/40; G11C 7/00
[52] U.S. Cl. .................. 365/205; 307/356; 307/DIG. 3; 307/DIG. 4; 365/184
[58] Field of Search .............. 365/184, 185, 201, 205; 307/DIG. 3, 356, 358, 279, 238

[56] References Cited

U.S. PATENT DOCUMENTS

| | | | |
|---|---|---|---|
| 3,579,204 | 5/1971 | Lincoln | 307/238 |
| 3,909,806 | 9/1975 | Uchida | 307/238 |
| 3,955,101 | 5/1976 | Amelio et al. | 307/DIG. 3 |

*Primary Examiner*—Bernard Konick
*Assistant Examiner*—Donald McElheny
*Attorney, Agent, or Firm*—Douglas L. Tschida; Kenneth T. Grace; William E. Cleaver

[57] ABSTRACT

A method and sense latch circuit are described for determining the memory retention characteristics of differentially sensed metal nitride oxide semiconductor field effect transistor (MNOS FET) memory cells and arrays made up of such cells. The method involves substitution of one differential comparator input with a known reference voltage (VR) for determining the analog voltage threshold levels of the memory cells.

The sense latch circuit, which can be fabricated as an integrated circuit, is responsively coupled to control inputs so that it can be operated in either a read or memory retention interrogation mode. The determination of the analog threshold levels of each cell of an array at given times permits the determination of the array's memory window (i.e., memory retention characteristics).

12 Claims, 8 Drawing Figures

MNOS FET MEMORY RETENTION CHARACTERIZATION TEST CIRCUIT

COPENDING APPLICATION

The subject invention is related to the copending application of Merton A. Horne and Bruce A. Brillhart filed of even-date, 821,271 entitled MNOS FET MEMORY RETENTION CHARACTERIZATION TEST CIRCUIT WITH ENHANCED SENSITIVITY AND POWER CONSERVATION.

BACKGROUND OF THE INVENTION

In the field of semiconductor memories, a nonvolatile differential memory cell can be constructed from two variable threshold MNOS FETs (metal nitride oxide semiconductor field effect transistor) appropriately configured with associated circuitry, and a plurality of these cells can be fabricated as an integrated circuit to form a memory array. The positive and negative changes which can be induced in the threshold voltage of the MNOS FETs by applying a relatively high electric field across the gate insulator produces a hysteresis effect. This hysteresis effect enables use of the variable threshold MNOS FET for binary memory storage, wherein the binary states are defined by the high and low conductive threshold levels and where the memory retention time is defined as the period between the instant of writing an MNOS memory FET into a given high or low conduction threshold level and the instant when the high and low conduction thresholds become indistinguishable from each other. Subsequent to writing an MNOS memory FET into a high or low conduction threshold level, the preset level decays to a value intermediate the high and low threshold levels. The threshold levels vary from device to device and chip to chip however, and the rapidity of the decay is dependent on the write cycle level and duration, the number of read cycles and the amount of read disturb, see pending U.S. patent application of Robert J. Lodi, Ser. No. 736,651.

Valid retention beyond $10^8$ seconds is possible before the high and low conduction thresholds become indistinguishable, but because of the variation in threshold levels within a cell, from cell to cell and from array to array; and because retention depends on the separation of the threshold levels, it is desirable to be able to test each MNOS memory FET for its characteristic threshold levels to determine the voltage separation between the thesholds of each MNOS memory FET of a cell at any given time after writing. In this manner the memory retention characteristics of each cell of an array can be determined.

A test circuit which can individually access each MNOS memory FET in each cell of an array makes it possible to determine the composite retention characteristics of the array as well as the worst case cell of the array.

SUMMARY OF THE INVENTION

The memory retention characteristics of an MNOS FET memory cell are directly related to the differential separation of the voltage threshold levels of the transistors and the decay rate of each transistor. The sense latch circuitry of the present invention provides a means for individually testing the four voltage threshold levels of each two transistor cell of an array, from which information a composite memory window can be determined at a given time after writing, which defines the memory retention characteristics of the array.

An individual memory cell into which binary information has been written is selected via associated chip address decoding circuitry for interrogation. The binary information corresponding to one MNOS FET being set at its upper threshold (high conduction state) while the other MNOS FET is set at its lower threshold (low conduction state). An override signal (OR) and either a left select (L/R) or a right select (L/R) signal are applied to their respective inputs of a left-right override select circuit to couple one of the MNOS FET outputs and a voltage reference source (VR) to opposing sides of the bistable latch of the sense latch circuit. The bistable latch is set to a balanced state and upon the timing out of the complement of the data strobe signal (DS) the bistable latch sets in response to the MNOS FET's output threshold. By incrementing or decrementing VR over several read retention cycles, the bistable latch switches to its opposite state, at which point the specific analog threshold voltage of the MNOS FET is determined. Repeating the above procedure with the other of the select signals permits interrogating the voltage threshold of the other MNOS FET of the selected cell. The differential separation between the two threshold voltages defines the memory window for one of the binary values of the differential cell.

A write sequence is performed with opposite data and each of the MNOS FETs are again interrogated in the above manner to determine the memory window for the cells other binary value. The test circuitry therefore provides a means for directly determining the voltage thresholds of the MNOS FETs, from which information the memory retention characteristics of a cell can be extrapolated. By addressing each cell of an array and repeating the test sequence, the memory threshold retention characteristics of the array can be determined.

The sense latch, when not coupled in the memory retention interrogation mode, can be coupled in a read interrogation mode for sensing the binary data stored within the memory cells of the memory array. During this read interrogation mode the left-right override select circuit isolates the VR inputs so that the sense latch circuit responds only to the respective differential MNOS FET threshold levels of the addressed memory cells.

The sense latch and override select circuitry are chip compatible and can be fabricated on the same integrated circuit chip as the MNOS FET memory array.

DESCRIPTION OF THE PREFERRED EMBODIMENT

Figure 1:
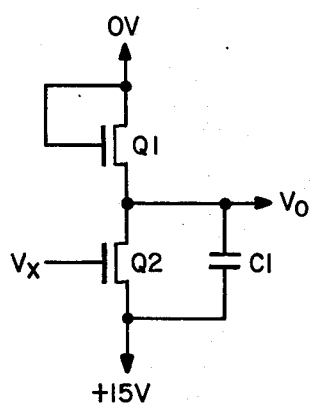
FIG. 1 is the minimum read disturb circuit for sensing the voltage threshold of an MNOS FET, the output voltage $V_O$ appears as the MEM or $\overline{\text{MEM}}$ input to the circuit of FIG. 3.

The present invention teaches a sense latch circuit 10 with associated data-out buffering for sensing the differential memory data stored within the MNOS FET memory cells of a semiconductor memory array. The sense latch circuit in conjunction with the left-right override select circuit has the additional capability of permitting the individual interrogation of the analog voltage thresholds of the memory cells for determining the memory retention characteristics as a function of time of each memory cell of an array. The memory cells are of the differential type, wherein the voltage thresholds of the variable threshold MNOS FETs define binary information. The memory cells are arranged in an array, which memory array is addressed by appropriate circuitry to select the proper columns and rows for the writing and reading of binary information into and out of the memory cells of the array.

The bistable devices used in the memory cells of the present invention are metal nitride oxide semiconductor field effect transistors (MNOS FET), which possess two variable voltage threshold states, typically on the order of a −3 volts and a −10 volts. The voltage thresholds define binary 1's and 0's within the memory cells by establishing the voltage threshold of one of the MNOS FETs at −10 volts and a voltage threshold of the other MNOS FET at a −3 volts or vice versa. The differential relationship of the two thresholds of each of the two MNOS FETs defines the respective 1's and 0's which are stored within the cells of the array.

Due to the inherent nature of the MNOS FET however, the voltage thresholds, which are fixed by the storage of charge in the insulated gate of the MNOS FET, decays over time. This decay will occur irrespective of whether binary information is read out of or written into the MNOS FET, and the decay rate is also affected by the level of the writing and reading signals that are used as well as the number of reads which are performed between write operations. The decay is typically linear over log time but will vary from device to device as well as from cell to cell. It is therefore desirable to be able to test the individual MNOS FETs of each and every cell of an array to determine the specific memory retention characteristics of the array. Once the specific voltage threshold levels are known for an individual device, the device retention can be predicted by extrapolating from the nearly linear edges of the decay rate over log time. In this manner, by individually interrogating each MNOS FET of an array, the memory window of the array and the worst case cells and conditions can be determined.

The MNOS FETs and the metal oxide semiconductor field effect transistors (MOS FET) of the circuitry described hereinafter are of the P channel type, but can also be of the N channel type. The use of MNOS FETs and MOS FETs permit the fabrication of the memory array, its associated addressing circuitry, the sense latch circuitry, data buffering circuitry and the left-right override select circuitry on a single integrated circuit chip. The typical width-to-length ratios of the MOS FETs when fabricated as an integrated circuit are set forth in the following table:

| WIDTH/LENGTH RATIOS OF MOS FET'S | |
|---|---|
| MOS FET | W/L |
| 1, 3, 9, 11, 13, 15, 17, 19, 21, 23, 94, 95, 97, 101, 105, 107 | 3/1 |
| 5, 7 | 6.5/1 |
| 25, 27 | 1/1.9 |
| 29, 31, 43, 53, 90, 93, 96, 100, 103, 106 | 1/1.25 |
| 42, 52 | 1/3.1 |
| 40, 50 | 2.5/1 |
| 41, 51 | 4.5/1 |
| 61 | 7.5/1 |
| 33, 60 | 10/1 |
| 92, 102 | 1/3.8 |
| 91, 104 | 8/1 |

Figure 2:
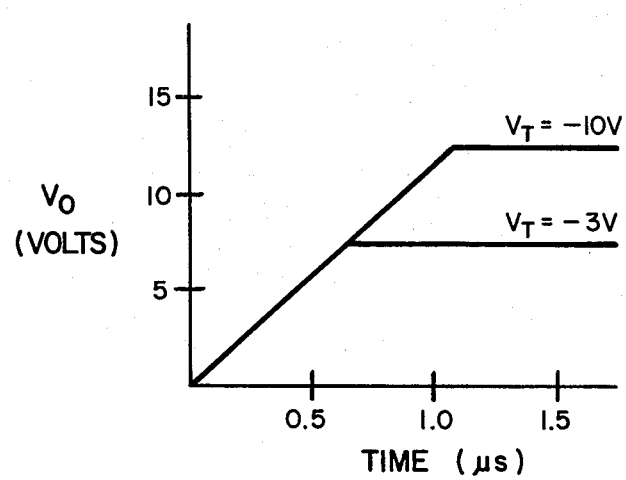
FIG. 2 is a plot of $V_O$ versus log time indicating representative values of $V_O$ and the correlation of $V_O$ to actual MNOS FET voltage threshold levels.

The sense latch and left-right override select circuitry of the present invention are used in conjunction with the pending U.S. patent application of Robert J. Lodi, Ser. No. 736,651, wherein a minimum read disturb technique and circuitry are taught for producing an MNOS FET output voltage $V_O$ corresponding to the voltage threshold of the MNOS FET. Referring to FIGS. 1 and 2, the specific MNOS FET voltage threshold levels which are applied as the MEM and $\overline{\text{MEM}}$ inputs to the circuitry of FIGS. 3 and 7 correspond to the voltage $V_O$. A $V_O$ of approximately 8 and 12 volts corresponds, respectively, to approximate MNOS FET voltage thresholds of a −3 and a −10 volts as can be seen in FIG. 2, but this separation or window will vary from device to device and as a function of time.

Figure 3:
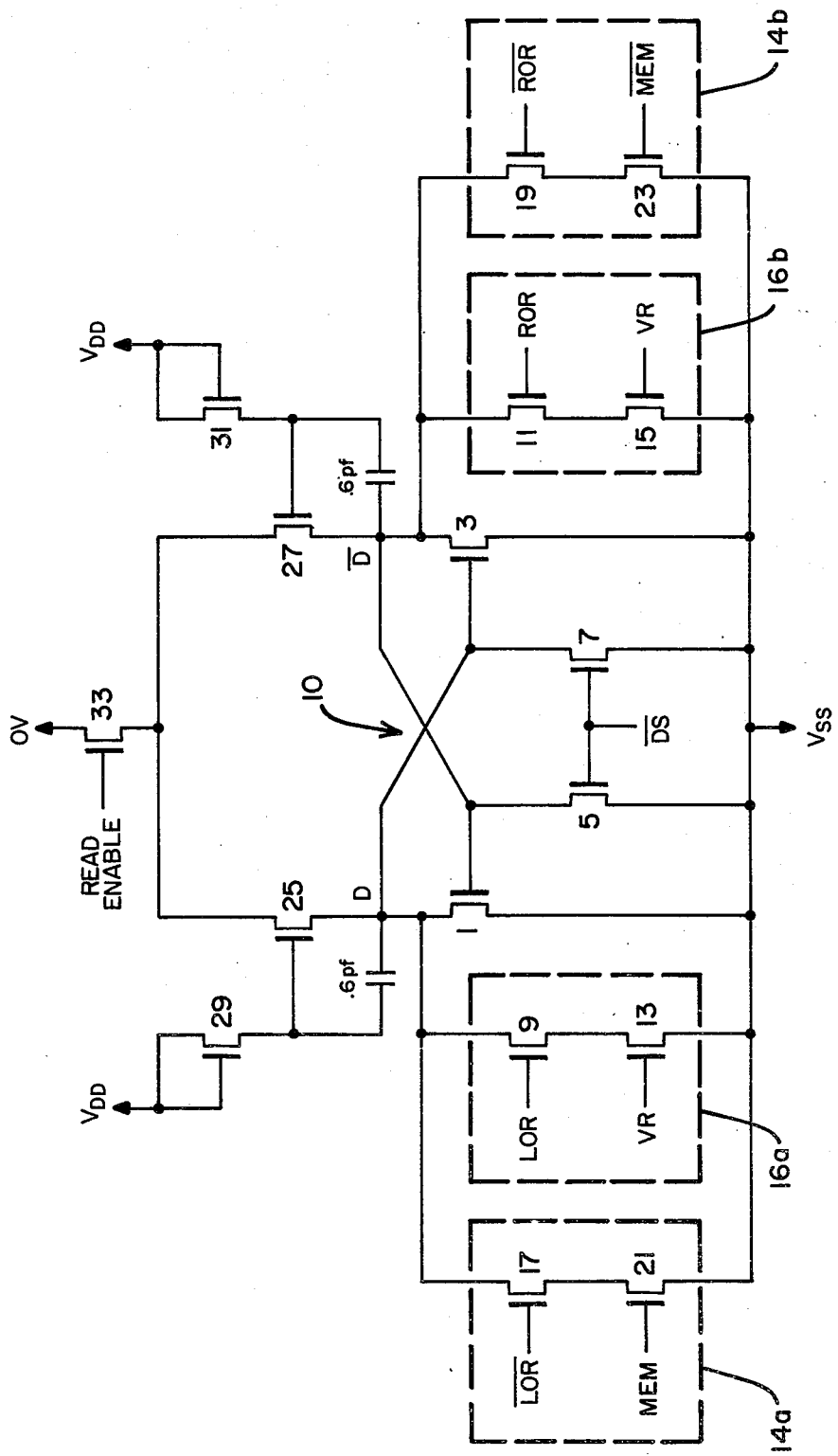
FIG. 3 is a schematic of the sense latch circuitry for determining the respective analog voltage thresholds of a memory cell.

The typical sequence of events which occurs during the testing of an array's memory retention characteristics will be described with reference to a single memory cell, recognizing that the same sequence will occur for each and every memory cell. The memory retention characteristics of an array are tested using the sense latch and left-right override select circuits shown in FIGS. 3 and 4, when the circuits are subjected to the signals and timing sequence as disclosed in FIGS. 5 and 6. The chip select, address, write and row enable signals of FIG. 5 are necessary for addressing the individual memory cells to permit the reading of binary information out of the selected memory cells of the array, which are selected during either the read or memory retention interrogation modes. The sense latch circuit of FIG. 3 is shown with its associated data-out buffering in FIG. 7. The block diagram of FIG. 8 further describes the essence of the method and operation of the left-right override select and analog sensing of the voltage thresholds of the MNOS FETs.

Figure 4:
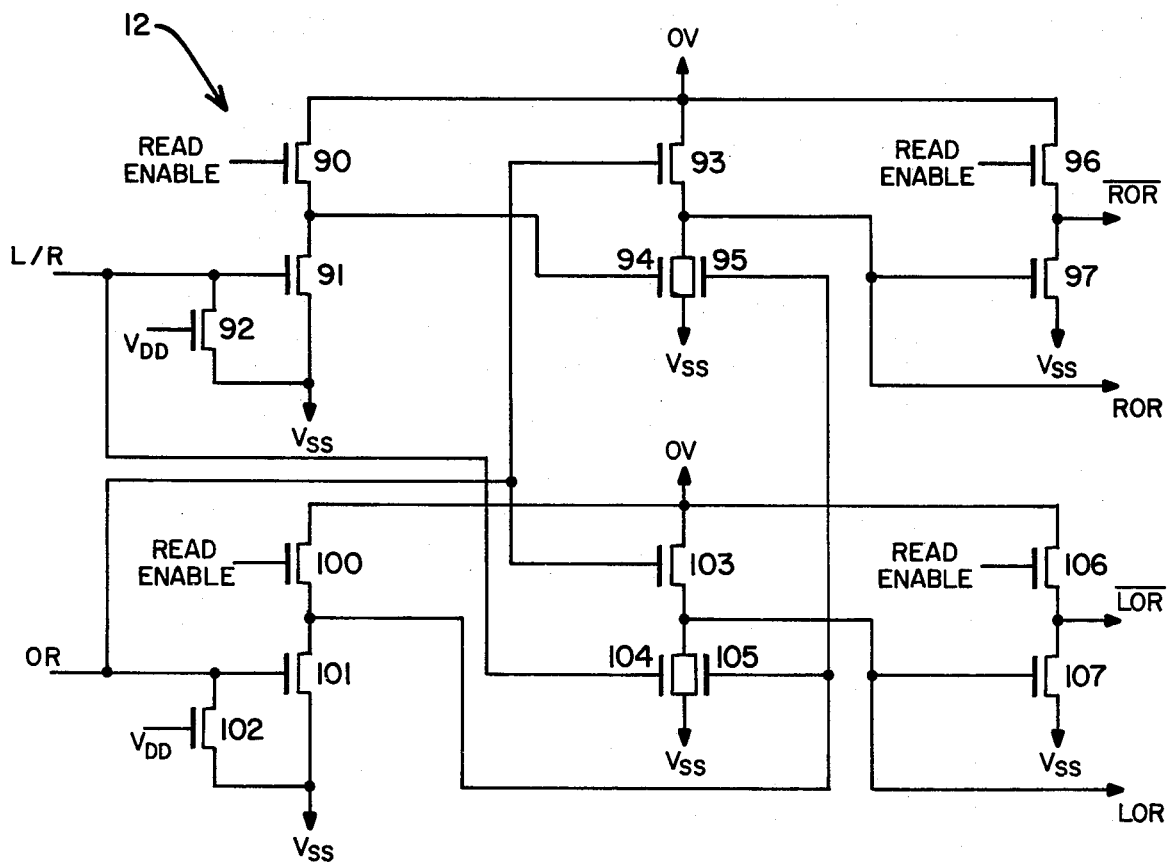
FIG. 4 is a schematic of the left-right override select circuitry for selectively coupling VR and the MNOS FET outputs, MEM and $\overline{\text{MEM}}$, to the sense latch circuitry of FIG. 3.
Figure 5:
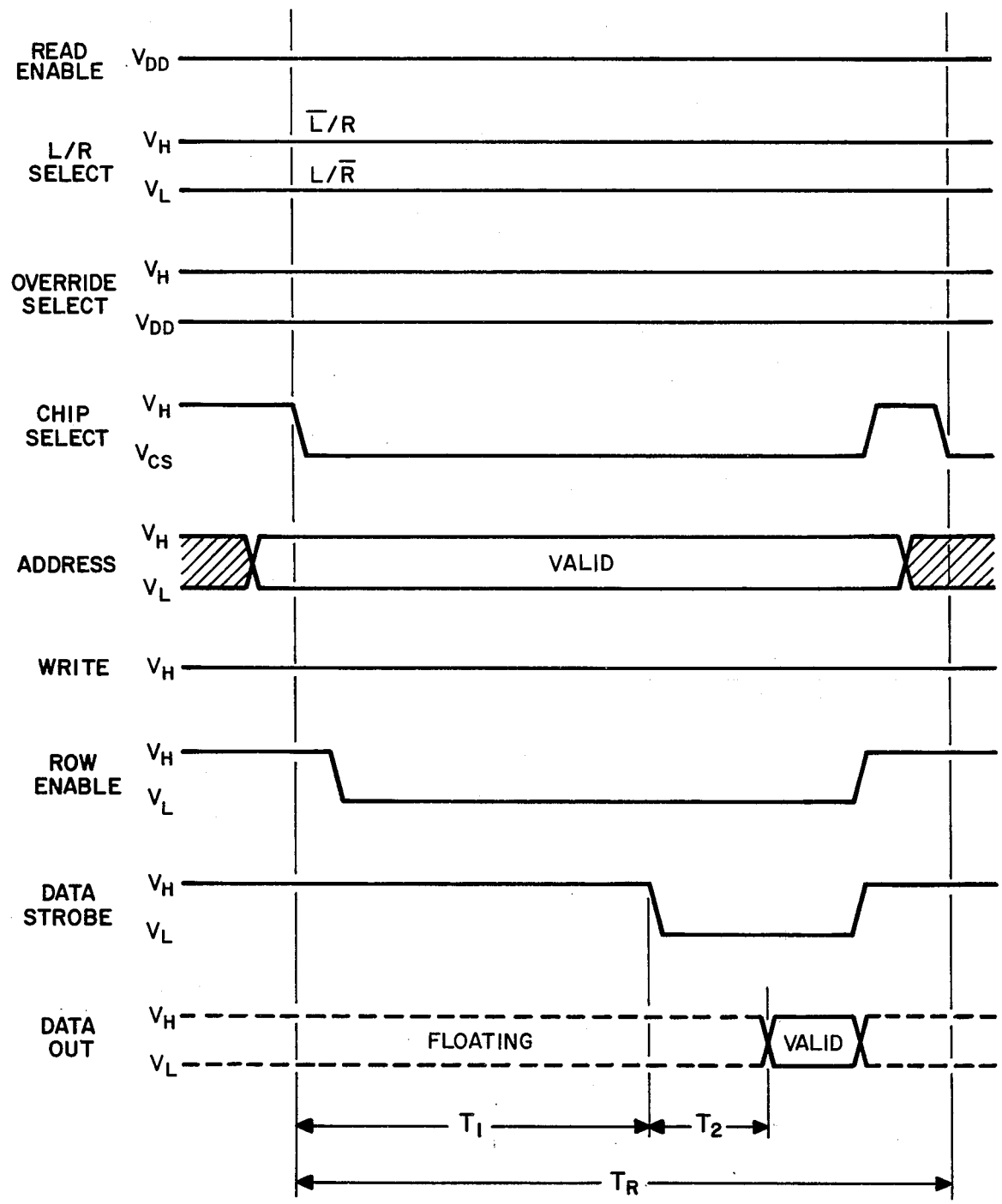
FIG. 5 is the read cycle timing sequence for the sense latch and left-right override select circuitry.
Figure 8:
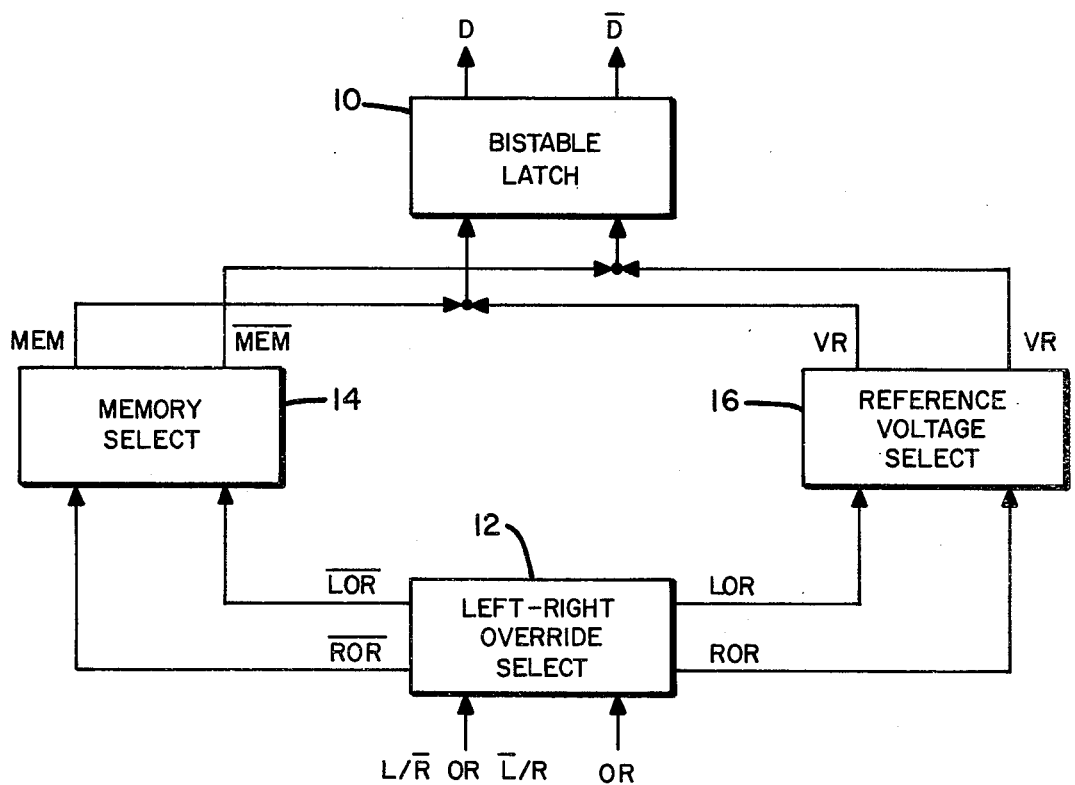
FIG. 8 is a block diagram of the modes of operation of the sense latch circuit.

Referring to FIG. 8 the test sequence is initiated with the application of an override signal OR and either a left select L/$\overline{\text{R}}$ or a right select $\overline{\text{L}}$/R signal to the left-right override select circuit 12, see FIG. 4, where the appropriate left override select LOR and right override select ROR interrogation signals and their complements $\overline{\text{LOR}}$, $\overline{\text{ROR}}$ are generated. Depending upon the selection signals, the complement left override signal $\overline{\text{LOR}}$ or complement right override signal $\overline{\text{ROR}}$ will select one of the MNOS FETs of the addressed memory cell for interrogation. The memory select circuitry 14 consisting of 14a and 14b, see FIG. 3, is responsively coupled to $\overline{\text{LOR}}$ and $\overline{\text{ROR}}$ to couple one of the MNOS FET outputs, either MEM or $\overline{\text{MEM}}$, to one side of the bistable latch 10. At the same time LOR and ROR are coupled to the reference voltage select circuitry 16 consisting of 16a and 16b, see FIG .3, to responsively couple a reference voltage VR to the other side of the bistable latch 10. This coupling of VR and the output of an MNOS FET to opposite sides of a bistable latch 10, permits the analog comparison of the two signals for sensing the specific analog voltage threshold of the MNOS FET being interrogated.

The left-right override select circuit 12 of FIG. 4 during a read cycle reacts to the override select OR signals of FIG. 5 to switch the sense latch circuitry of FIG. 3 between either a memory retention or a read interrogation mode. The read interrogation mode differs from the memory retention interrogation mode in that the reference voltage select circuitry 16a and 16b is isolated by turning MOS FETs 9 and 11 off by holding their respective gates at a logic level 0, corresponding to $V_H$ and typically +15V, except during the memory retention interrogation mode.

Analyzing the left-right override select circuit 12 of FIG. 4 during the memory retention interrogation mode, when impressed with the L/R and OR signals of FIG. 5, during a read cycle time $T_R$ for the respective right override and left override operations: the left-right override select circuit is enabled during the read or memory retention interrogation mode when the read enable signal, corresponding to $V_{DD}$ and typically 15V, is impressed on the gates of MOS FETs 90, 96, 100 and 106 causing them to turn "on", $V_{DD}$ is also impressed on the gates of MOS FETs 92 and 102 which causes them to turn "on" and bleed off stray currents.

During a right override select operation and looking to the $\overline{ROR}$ and ROR outputs: the L/R input is impressed with $V_H$ typically a +15V, which corresponds to a right select signal L/R, while the OR input is at $V_{DD}$. The MOS FETs 91 and 104 whose gates are connected to the L/R input turn "off" and the OR output of $V_{DD}$ applied to the gates of MOS FETs 101, 103 and 93 will cause these MOS FETs to turn "on". Looking to the ROR and $\overline{ROR}$ outputs: Turning on MOS FET 90 causes the 0V source, connected to the drain of MOS FET 90, to be impressed on the gate of MOS FET 94 and turns "on" MOS FET 94. Due to the difference in the conductance of the "on" MOS FETs 100 and 101 the $V_{SS}$ source, typically a +15V, appears on the common source-drain connection of MOS FETs 100 and 101 and is impressed on the gates of MOS FETs 105 and 95 causing them to turn "off". Because MOS FET 94 is "on" and due to the difference in conductivity between the common source-drain connected MOS FETs 93 and 95, $V_{SS}$ is impressed on the gate of MOS FET 97 causing it to turn "off". The ROR output also connected to the gate of MOS FET 97 will therefore be at a logic level 0, corresponding to approximately a +15V. The $\overline{ROR}$ output connected to the source of the "on" MOS FET 96 and the drain of the "off" MOS FET 97 is coupled to the 0V source connected to the drain of MOS FET 96 and will be at a logic level 1, corresponding to approximately 0V.

The ROR and $\overline{ROR}$ signals during a right override select operation, when coupled to the gates of MOS FETs 11 and 19, respectively, of FIG. 3 will cause MOS FET 19 to turn "on" and MOS FET 11 to turn "off", thereby isolating any effect of the VR input to the gate of MOS FET 11 and coupling the right MNOS FET output $\overline{MEM}$ of the addressed cell via the gate of MOS FET 23 to the right side of bistable latch 10 at node $\overline{D}$.

Looking to the LOR and $\overline{LOR}$ outputs during the right override select operation when L/R is still at +15V and OR is at −15V: Due to the conductance difference between the "on" MOS FETs 104 and 103, $V_{SS}$ appears on the common source-drain connection of MOS FETs 103 and 104 and is impressed on the gate of MOS FET 107 causing it to turn "off". The LOR output also connected to the gate of MOS FET 107 will therefore be at a logic level 0. The $\overline{LOR}$ output connected to the source of the "on" MOS FET 106 and the drain of the "off" MOS FET 107 coupled to the 0V source connected to the drain of MOS FET 106 and will be at a logic level 1.

The LOR AND $\overline{LOR}$ outputs during a right override select operation, when coupled to the gates of MOS FETs 9 and 17, respectively, of FIG. 3, will cause MOS FET 9 to turn on and MOS FET 17 to turn off, thereby isolating the left MNOS FET output MEM of the addressed cell; and coupling VR via the gate of MOS FET 13 to the left side of bistable latch 10 at node D.

During a left override select operation the L/R input is impressed with a left select signal L/R, corresponding to $V_L$ and typically 0V while the OR input remains at $V_{DD}$. The MOS FETs of the left-right override select circuitry reacting to the different L/R input and to the differing conductance levels of the MOS FETs in a similar manner as for a right select will produce ROR and LOR outputs at a logic level 0 and $\overline{ROR}$ and $\overline{LOR}$ outputs at a logic level 1. The MOS FETs 19 and 9 of the sense latch whose gates are connected to the respective ROR and LOR outputs will turn off and isolate the MNOS FET output MEM; while the MOS FETs 11 and 17 whose gates are connected to the respective $\overline{ROR}$ and $\overline{LOR}$ outputs will turn on and couple VR via the gate of MOS FET 15 to the right side of bistable latch 10 and MEM via the gate of MOS FET 21 to the left side of latch 10.

During the read interrogation mode, the OR input is impressed with $V_H$, typically a +15V, which causes MOS FETs 101, 93 and 103 to turn "off". The read enable signal $V_{DD}$ applied to the gates of MOS FETs 90, 96, 100 and 106 causes these MOS FETs to turn "on". The 0V source connected to the drains of MOS FETs 90 and 100 is then coupled to the gates of MOS FETs 94, 105 and 95 causing these MOS FETs to turn "on" and couple $V_{SS}$, which is connected to the source of each of these MOS FETs, to the gates of MOS FETs 97 and 107, which causes MOS FETs 97 and 107 to turn "off". ROR and LOR will therefore be at approximately a −15V, and $\overline{ROR}$ and $\overline{LOR}$ will be at approximately 0V due to the coupling of the 0V source via the drains of the "on" MOS FETs 96 and 106.

The LOR and ROR signals during the read interrogation mode will cause MOS FETs 9 and 11 of the sense latch to turn "off" and isolate the sense latch circuit from any effects of VR. $\overline{LOR}$ and $\overline{ROR}$ will cause MOS FETs 17 and 19 to turn "on" and couple the drains of MOS FETs 21 and 23 to nodes D and D which causes the bistable latch 10 to switch in response to the differential binary data thresholds MEM and $\overline{MEM}$.

During time $T_1$ of a read cycle, see FIG. 5, the proper override select coupling is achieved, a specific memory cell is addressed for interrogation, the data out node of the tristate output is floating and the nodes D and $\overline{D}$ of bistable latch 10 are precharged to permit the analog comparison between the signal levels VR and either MEM or $\overline{MEM}$. Referring to FIGS. 3 and 5 during time $T_1$, the complement data strobe $\overline{DS}$ signal, which corresponds to $V_H$ and typically a +15V, is impressed on the gates of MOS FETs 5 and 7, turning them "on" and causing $V_{SS}$ to be coupled via the source of MOS FETs 5 and 7 to the data nodes D and $\overline{D}$ of bistable latch 10, thereby placing latch 10 in a balanced precharged state.

Assuming that the voltage threshold of the right $\overline{MNOS}$ FET output MEM is to be interrogated, MOS FET 9 will be "on" thereby coupling $V_{SS}$ via the source of MOS FET 13 to D and the gate of MOS FET 3; MOS FET 19 will be "on" thereby coupling $V_{SS}$ via MOS FET 23 to $\overline{D}$ and the gate of MOS FET 1. In this manner the VR input to the gate of MOS FET 13 and the $\overline{MEM}$ input to the gate of MOS FET 23 will determine the conductance of the respective MOS FETs and the consequent switching of the bistable latch 10 from its balanced precharged state. Because the MOS FETs 9, 13, 1, 3, 19 and 23 all have approximately the same conductivity, the switching of the bistable latch 10 should be dependent only upon the relative inputs VR and $\overline{MEM}$ to the gates of the MOS FETs 13 and 23.

Figure 6:
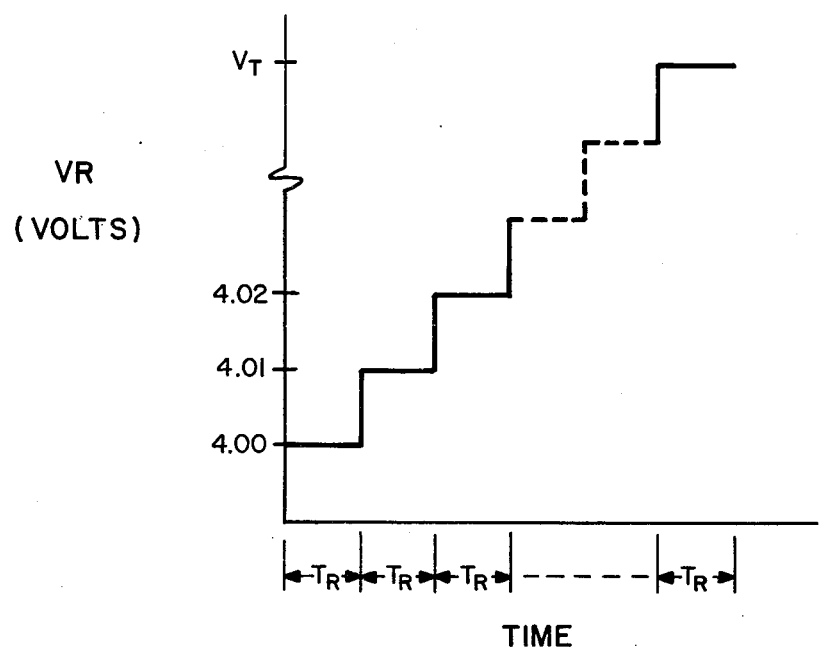
FIG. 6 is a representation of the waveshape of the typical reference voltage VR.

The VR input signal to the gate of MOS FET 13 is initially set at a level below that of the expected voltage threshold level of the MNOS FET, typically +4V, and in this manner the complement data output node $\overline{D}$ will fall faster from the +15 volt precharge level than node D, thereby causing MOS FET 1 to turn "on" which will cause MOS FET 3 to turn "off". The bistable latch 10 will assume one of its two stable states, which state will reoccur as long as VR is less than $\overline{MEM}$. By incrementing the VR input gradually over several read cycles until the bistable latch 10 changes states, a precise indication of the analog voltage threshold of the MNOS FET output $\overline{MEM}$ can be determined. Referring to FIG. 6, a typical VR input signal is shown and is comprised of a series of DC voltage steps beginning at typically a +4 volts and incremented in 10 millivolt steps until the bistable latch 10 switches at $V_T$, the analog voltage threshold, corresponding to $\overline{MEM}$ and reflected as a voltage $V_O$. Each incremental test requires a read time $T_R$, corresponding to one read cycle, but the initial voltage level and incremental step size can be adjusted to minimize the total test time or to achieve a more or less precise determination of $V_T$.

Figure 7:
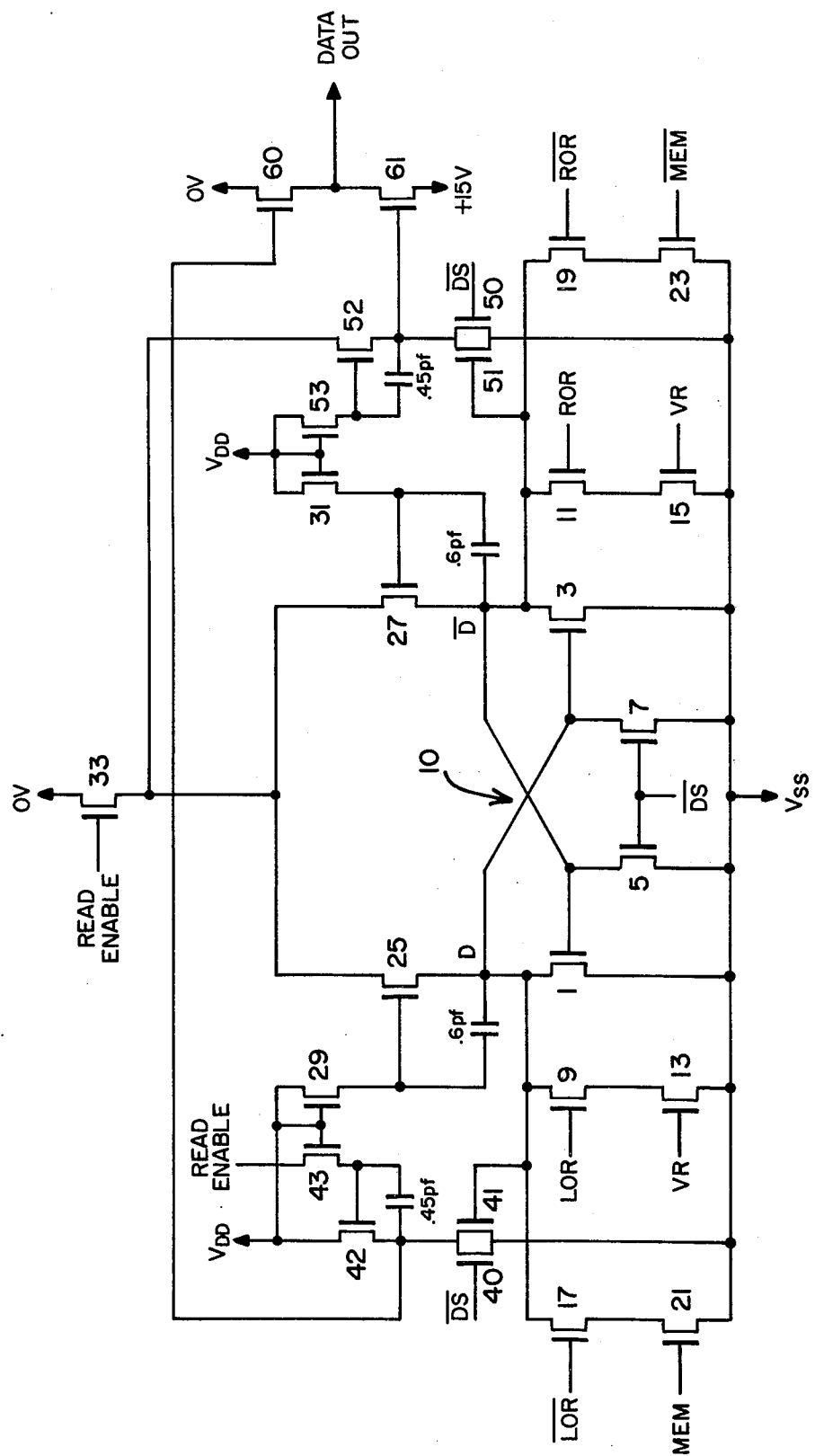
FIG. 7 is a representation of the sense latch circuitry of FIG. 3 with associated data buffering circuit.

Referring to FIG. 7 during a read operation the read enable signal turns MOS FET 33 "on" and the voltage source $V_{DD}$ is connected to the individual bootstrap circuits, which are comprised of MOS FETs 29 and 25 and MOS FETs 31 and 27 and their respective 0.6 pico farad capacitors. The bootstrap circuits maintain the balanced precharged state on the D and $\overline{D}$ nodes during $T_1$. When $\overline{DS}$ goes high, releasing bistable latch 10 from its balanced state, the latch 10 does not switch immediately, see FIG. 5, but requires a time $T_2$ before the charge decay via the bootstrap action is sufficient to cause the latch 10 to switch. Once the latch 10 is switched the latch outputs appearing on nodes D and $\overline{D}$ will be outputted via the data buffering circuitry and appear on the data out node. During the memory retention interrogation mode, the same data will appear on the data out node after each of the successive memory retention interrogations until $V_T$ is reached, then the data out node will switch. The data change will define the analog threshold of the MNOS FET output being interrogated and will cause the left-right override select circuit to switch to the other of its left or right select operations.

In this manner the sense latch circuit of FIG. 7 is able to determine the voltage threshold $V_T$ of the selected MNOS FET output MEM or $\overline{MEM}$, reflected as a voltage $V_O$ corresponding to that which is inputted from the minimum read disturb circuit of FIG. 2 to the gate of MOS FET 21 and 23.

The interrogation of the analog voltage threshold level of the left MNOS FET output MEM, impressed on the gate of MOS FET 21, is performed by doing a left override select and repeating the above procedure to determine the voltage threshold $V_T$ of the left MNOS FET output MEM. In this manner the respective voltage threshold levels of the right and left MNOS FETs $\overline{MEM}$ and MEM for a single cell and binary value can be determined. To determine the other two voltage threshold states of the cell's MNOS FETS, it is necessary to perform a write operation by appropriate means on the addressed memory cell to change the data states of the MNOS FETs. The selective memory retention interrogation of the individual MNOS FETs is then repeated in a similar manner as above to determine the respective MNOS FET voltage thresholds for the new binary state.

In this manner the two unique analog voltage threshold levels for each of the respective MNOS FETs of the addressed memory cell are interrogated to define the memory window of the addressed memory cell. By repeating a similar sequence of steps for each and every memory cell of an array, the memory window for the entire array can be determined.

A similar technique as herein described can also be implemented for determining the analog voltage threshold levels of a memory array comprised of single device MNOS FET cells.

What is claimed is:

1. A sense latch circuit selectively operable in either a read or a memory retention interrogation mode for reading binary data from a plurality of semiconductor memory cells each of said cells comprised of at least one variable threshold transistor, or for testing each of the memory cells to determine the plurality of analog threshold voltages peculiar to each of the cells, comprising:

a bistable latch means having two stable states and first and second output nodes for comparing two signals, at least one of said signals functionally related to one of the threshold voltages peculiar to one of said cells, to determine the binary data stored in said memory cells or to determine the analog threshold voltages peculiar to each of said cells;

memory select means coupled to said memory cells and said bistable latch means for coupling said signals functionally related to said threshold voltages to said nodes of said bistable latch means;

reference voltage select means coupled to said bistable latch means and a reference voltage source for coupling a reference voltage to one or the other of said nodes of said latch means;

override select means coupled to said memory select means and said reference voltage select means for selectively coupling said reference voltage and said signals functionally related to said threshold voltages to said bistable latch means in either said read interrogation mode or said memory retention interrogation mode and responsively switching said bistable latch between its stable states;

the stable states of said bistable latch means in said read mode corresponding to binary information stored in said memory cells;

the stable states of said bistable latch means in said memory retention interrogation mode indicative of the plurality of analog threshold voltages peculiar to each of said plurality of said memory cells tested.

2. A sense latch circuit as set forth in claim 1, wherein said variable threshold transistor is a metal nitride oxide semiconductor field effect transistor.

3. A sense latch circuit as set forth in claim 1, wherein said memory cell is comprised of a plurality of variable threshold transistors.

4. A sense latch circuit as set forth in claim 3, wherein said variable threshold transistors are metal nitride oxide semiconductor field effect transistors.

5. A sense latch circuit as set forth in claim 1 fabricated as an integrated circuit.

6. A sense latch as set forth in claim 1 wherein said bistable latch means comprises:
   a first and a second transistor, each transistor having a source, a gate and a drain electrode, said gate electrode of said first transistor coupled to said drain electrode of said second transistor and said gate electrode of said second transistor coupled to the drain electrode of said first transistor and said source electrodes of said first and second transistors coupled together;
   a first voltage source coupled to said common source connection of said first and second transistors;
   a first and a second load device, each load having two electrodes, one of said electrodes of said first load coupled to the drain of said first transistor, one of said electrodes of said second load coupled to the drain of said second transistor and the other electrode of each of said first and second loads coupled together;
   a second voltage source coupled to the common electrode connection of said first and second loads;
   a first output node at said drain electrode of said first transistor;
   a second output node at said drain electrode of said second transistor.

7. A sense latch as set forth in claim 5 including precharge means comprising:
   a third and fourth transistor, each transistor having a source, a gate and a drain electrode, said drain of said third transistor coupled to the gate of said first transistor and said drain of said fourth transistor coupled to the gate of said second transistor and said sources of said third and fourth transistors coupled to the common connection of said first and second transistors;
   a first capacitor parallel coupled to said first load device;
   a second capacitor parallel coupled to said second load device;
   means for applying a precharge voltage to the gates of said third and fourth transistors during a precharge time period and causing said first and second output nodes to charge to a predetermined value prior a time period during which said bistable latch means compares said two signals.

8. A sense latch as set forth in claim 6, wherein said memory select means comprises:
   first and second halves, each half comprising:
      a fifth and sixth transistor, each transistor having a source, a gate and a drain electrode, said source electrode of said fifth transistor coupled to said drain of said sixth transistor, said gate of said fifth transistor coupled to said override select means, said gate of said sixth transistor coupled to said memory cells;
   said drain electrode of said fifth transistor of said first half coupled to said first node of said bistable latch means;
   said drain electrode of said fifth transistor of said second half coupled to said second node of said bistable latch means;
   said source electrode of said sixth transistor of each of said first and second halves coupled to said common source connection of said first and second transistors.

9. A sense latch as set forth in claim 6, wherein said reference voltage select means comprises:
   third and fourth halves, each half comprising:
      a seventh and eighth transistor, each transistor having a source, a gate and a drain electrode, said source electrode of said seventh transistor coupled to said drain of said eighth transistor, said gate of said seventh transistor coupled to said override select means, said gate of said sixth transistor coupled to said reference voltage source;
   said drain electrode of said seventh transistor of said third half coupled to said first node of said bistable latch means;
   said drain electrode of said seventh transistor of said fourth half coupled to said second node of said bistable latch means;
   said source electrode of said eighth transistor of each of said third and fourth halves coupled to said common source connection of said first and second transistors.

10. A sense latch circuit selectively operable in either a read mode for reading binary data from a plurality of differential memory cells, each cell comprised of two variable threshold transistors, or a memory retention mode for testing each of the memory cells to determine the analog threshold voltages peculiar to the cell's variable threshold transistors, comprising:
   a bistable latch means having two stable electrical states for comparing two signals, at least one of said signals functionally related to one of the threshold voltages peculiar to one of said variable threshold transistors, comprising:
      a first and a second transistor, each having a source, a gate and a drain electrode, said gate electrode of said first transistor coupled to said drain electrode of said second transistor and said gate electrode of said second transistor coupled to the drain electrode of said first transistor and said source electrodes of said first and second transistors coupled together,
      a first voltage source coupled to said common source connection of said first and second transistor,
      a third and fourth transistor, each having a source, a gate and a drain electrode, said source of said third transistor coupled to said drain of said first transistor and said source of said fourth transistors coupled to said drain of said second transistor and said drains of said third and fourth transistors coupled together,
      a second voltage source coupled to the gates of said third and fourth transistors,
      a first capacitor parallel coupled to said gate and drain electrodes of said third transistor, a second capacitor parallel coupled to said gate and drain electrodes of said fourth transistor, a fifth transistor having a source, a gate and a drain electrode, said source electrode coupled to said common drain connection of said third and fourth transistors a third voltage source coupled to said drain electrode of said fifth transistor, a sixth and seventh transistor each having a source, a gate and a drain electrode, said drain of said sixth transistor coupled to the gate of said first transistor and said drain of said seventh transistor coupled to the gate of said second transistor said sources of said sixth and seventh transistors coupled to said common connection of said first and second transistors, a first output node at said drain electrode of said first transistor, a second output node at said drain electrode of said second transistor, means for applying a read voltage to said gate of said fifth transistor during said read or memory retention modes of operations, means for applying a precharge voltage to the gates of said sixth and seventh transistors during a precharge time period and causing said first and second output nodes to charge to a predetermined value;

memory select means coupled to said memory cells and said bistable latch means for coupling a first signal functionally related to the threshold of one of said cell's variable threshold transistors to said first node and a second signal functionally related to the threshold of the other of said cell's variable threshold transistors to said second node;

reference voltage select means coupled to said bistable latch means for selectively coupling a reference voltage source to either said first or said second nodes;

override select means coupled to said memory select means and said reference voltage select means for causing said memory select means to couple said signals functionally related to the thresholds of the cell's variable threshold transistors to said latch means and isolate said reference voltage source from said latch means during said read mode or for causing said memory select means to isolate one of said signals functionally related to the thresholds of the cell's variable threshold transistors from its associated node and to instead couple said reference voltage source to the node during said memory retention mode and responsively switching said bistable latch between its stable states;

the stable states of said bistable latch in said read interrogation mode corresponding to the binary information stored in said memory cells;

the stable states of said bistable latch in said memory retention interrogation mode indicative of the analog threshold voltages peculiar to the variable threshold transistor tested.

11. A sense latch circuit as set forth in claim 10, wherein said variable threshold transistors are metal nitride oxide semiconductor field effect transistors.

12. A sense latch circuit as set forth in claim 10, fabricated as an integrated circuit.

* * * * *

UNITED STATES PATENT AND TRADEMARK OFFICE
CERTIFICATE OF CORRECTION

PATENT NO. : 4,127,901
DATED : November 28, 1978
INVENTOR(S) : Merton A. Horne, et al It is certified that error appears in the above-identified patent and that said Letters Patent are hereby corrected as shown below:

Column 9, Line 41, "claim 5" should be
-- claim 6 --.

Signed and Sealed this

Twentieth Day of March 1979

[SEAL]

Attest:

RUTH C. MASON
Attesting Officer

DONALD W. BANNER
Commissioner of Patents and Trademarks